(12) United States Patent
Hossain et al.

(10) Patent No.: US 9,620,639 B2
(45) Date of Patent: Apr. 11, 2017

(54) ELECTRONIC DEVICE INCLUDING A TRENCH AND A CONDUCTIVE STRUCTURE THEREIN

(71) Applicant: Semiconductor Components Industries, LLC, Phoenix, AZ (US)

(72) Inventors: Zia Hossain, Tempe, AZ (US); Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 19 days.

(21) Appl. No.: 14/725,064

(22) Filed: May 29, 2015

(65) Prior Publication Data

US 2015/0263166 A1    Sep. 17, 2015

Related U.S. Application Data

(62) Division of application No. 13/404,895, filed on Feb. 24, 2012, now Pat. No. 9,070,585.

(51) Int. Cl.
*H01L 29/78* (2006.01)
*H01L 29/423* (2006.01)
(Continued)

(52) U.S. Cl.
CPC ...... *H01L 29/7827* (2013.01); *H01L 29/1095* (2013.01); *H01L 29/407* (2013.01);
(Continued)

(58) Field of Classification Search
USPC ......................................... 257/331
See application file for complete search history.

(56) References Cited

U.S. PATENT DOCUMENTS 5,998,833 A    12/1999  Baliga
6,501,129 B2   12/2002  Osawa
(Continued)

OTHER PUBLICATIONS

Rutter, Phil et al., "Low Voltage Trench/MOS Combining Low Specific Rds(on) and Qg FOM", Proceedings of The 22nd International Symposium on Power Semiconductor Devices & ICs, Hiroshima, dated 2010, pp. 325-328.

*Primary Examiner* — Zandra Smith
*Assistant Examiner* — Lawrence Tynes, Jr.
(74) *Attorney, Agent, or Firm* — Abel Law Group, LLP

(57) ABSTRACT

An electronic device can include a transistor structure, including a patterned semiconductor layer overlying a substrate and having a primary surface. The electronic device can further include first conductive structures within each of a first trench and a second trench, a gate electrode within the first trench and electrically insulated from the first conductive structure, a first insulating member disposed between the gate electrode and the first conductive structure within the first trench, and a second conductive structure within the second trench. The second conductive structure can be electrically connected to the first conductive structures and is electrically insulated from the gate electrode. The electronic device can further include a second insulating member disposed between the second conductive structure and the first conductive structure within the second trench. Processing sequences can be used that simplify formation of the features within the electronic device.

17 Claims, 11 Drawing Sheets

(51) Int. Cl.
  *H01L 29/40* (2006.01)
  *H01L 29/417* (2006.01)
  *H01L 29/66* (2006.01)
  *H01L 29/10* (2006.01)

(52) U.S. Cl.
  CPC .. *H01L 29/41741* (2013.01); *H01L 29/41766* (2013.01); *H01L 29/4236* (2013.01); *H01L 29/66734* (2013.01); *H01L 29/7813* (2013.01); *H01L 29/42368* (2013.01)

(56) References Cited

U.S. PATENT DOCUMENTS

| | | | |
|---|---|---|---|
| 6,649,975 B2 | 11/2003 | Baliga | |
| 6,710,403 B2 | 3/2004 | Sapp | |
| 6,853,033 B2 | 2/2005 | Liang et al. | |
| 6,991,977 B2 | 1/2006 | Kocon | |
| 7,282,765 B2 | 10/2007 | Xu et al. | |
| 7,345,342 B2 | 3/2008 | Challa et al. | |
| 7,745,846 B2 | 6/2010 | Korec et al. | |
| 7,843,004 B2 | 11/2010 | Darwish | |
| 7,851,312 B2 | 12/2010 | Grivna | |
| 7,982,265 B2 | 7/2011 | Challa et al. | |
| 8,697,560 B2 | 4/2014 | Venkatraman et al. | |
| 8,889,532 B2 | 11/2014 | Burke et al. | |
| 8,969,956 B2 | 3/2015 | Venkatraman et al. | |
| 2007/0059887 A1 | 3/2007 | Poelzl et al. | |
| 2007/0235801 A1 | 10/2007 | Cheng et al. | |
| 2008/0073707 A1 | 3/2008 | Darwish | |
| 2009/0140327 A1 | 6/2009 | Hirao et al. | |
| 2010/0078718 A1* | 4/2010 | Blank | H01L 29/407 257/331 |
| 2010/0187602 A1 | 7/2010 | Woolsey et al. | |
| 2010/0187642 A1 | 7/2010 | Grivna | |
| 2010/0320534 A1 | 12/2010 | Pan et al. | |
| 2011/0039384 A1 | 2/2011 | Darwish | |
| 2011/0254086 A1* | 10/2011 | Hsieh | H01L 21/823481 257/330 |
| 2012/0292694 A1* | 11/2012 | Hsieh | H01L 29/407 257/331 |
| 2013/0153987 A1 | 6/2013 | Venkatraman et al. | |

* cited by examiner

ELECTRONIC DEVICE INCLUDING A TRENCH AND A CONDUCTIVE STRUCTURE THEREIN

CROSS-REFERENCE TO RELATED APPLICATION

The present application is a divisional application of U.S. patent application Ser. No. 13/404,895, filed Feb. 24, 2012, entitled "Electronic Device Including a Trench and a Conductive Structure Therein and a Process of Forming the Same," by Zia Hossain et al., which is incorporated by reference herein in its entirety.

FIELD OF THE DISCLOSURE

The present disclosure relates to electronic devices and processes of forming electronic devices, and more particularly to, electronic devices including trenches and conductive structures therein and processes of forming the same.

RELATED ART

Metal-oxide-semiconductor field-effect transistors (MOSFETs) are a common type of power switching device. A MOSFET includes a source region, a drain region, a channel region extending between the source and drain regions, and a gate structure provided adjacent to the channel region. The gate structure includes a gate electrode layer disposed adjacent to and separated from the channel region by a thin dielectric layer.

In optimizing the performance of a MOSFET, a designer is often faced with trade-offs in device parameter performance. Specifically, available device structure or fabrication process choices may improve one device parameter, but at the same time such choices may degrade one or more other device parameters. For example, available structures and processes that improve figure of merit, that is, on-resistance times total gate charge of a MOSFET, may increase the size of the die, and smaller die size may have a higher figure of merit.

BRIEF DESCRIPTION OF THE DRAWINGS

Embodiments are illustrated by way of example and are not limited in the accompanying figures.

Figure 1:
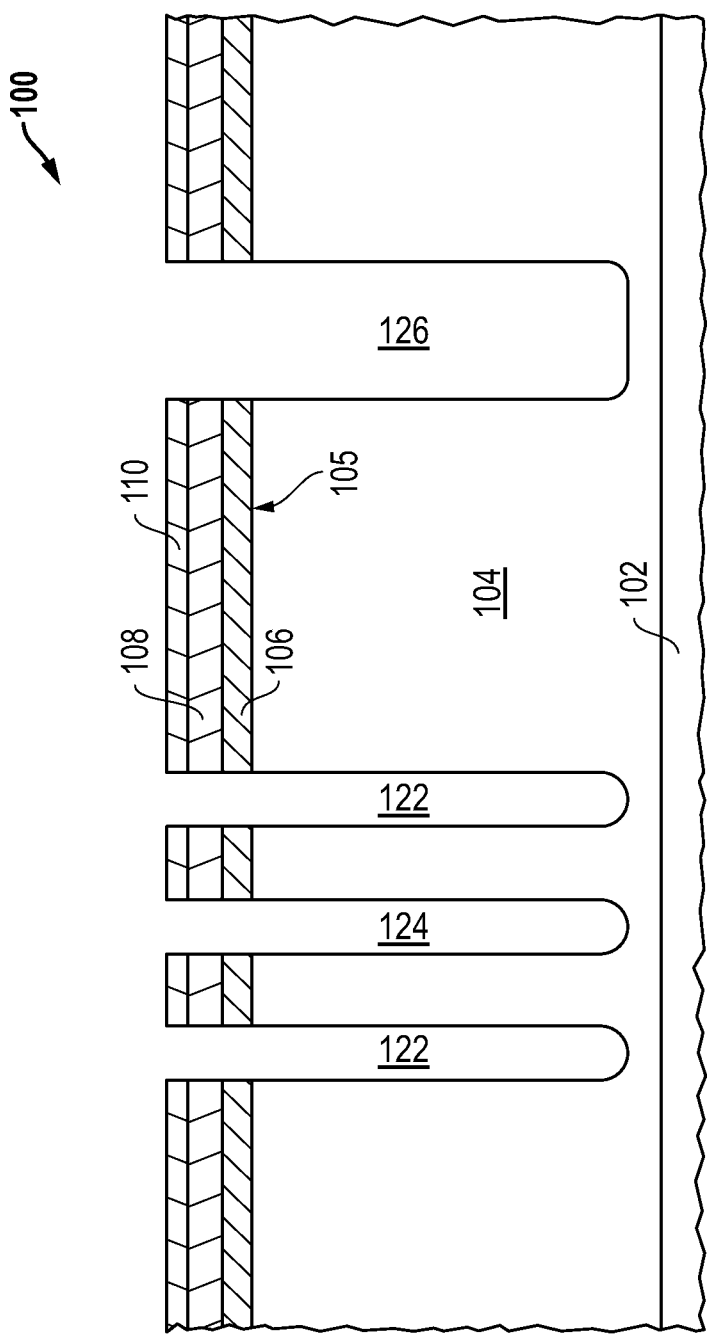
FIG. 1 includes an illustration of a cross-sectional view of a portion of a workpiece that includes an underlying doped region, a semiconductor layer, a pad layer, a stopping layer, and an etch-selectivity layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

As used herein, the term "channel length" is intended to mean the distance between a source region and a drain region of a transistor that is measured substantially parallel to the current flow through a channel region during normal operation. The term "channel width" is intended to mean a dimension of the channel region that is measured in a direction orthogonal to the channel length.

The term "normal operation" and "normal operating state" refer to conditions under which an electronic component or device is designed to operate. The conditions may be obtained from a data sheet or other information regarding voltages, currents, capacitance, resistance, or other electrical conditions. Thus, normal operation does not include operating an electrical component or device well beyond its design limits.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include trenches within an active area where approximately half of the gate electrodes within the trenches are removed and replaced by conductive structures. The fewer gate electrodes help to reduce gate capacitance ($Q_G$) and help to provide a lower figure of merit, which is a product of the on-resistance ($R_{DSON}$) times $Q_G$, as compared to conventional electronic devices including trench power MOSFETs. Therefore, the performance of the electronic device is significantly improved. Compared to conventional electronic devices that include lateral power MOSFETs, the electronic devices as described herein can provide a smaller die size and allow more flexibility in choosing a package for the electronic device. The benefits and details of the electronic device are better understood after reading the embodiments as described in detail below. Further, within an active area of an electronic device, contact to the conductive structures within the same trenches as the body contact regions can occur from the top side within the active region. As such, process integration may be simplified and allow more process margin to be realized.

FIG. 1 includes an illustration of a cross-sectional view of a portion of a workpiece 100. The workpiece 100 includes an underlying doped region 102, a semiconductor layer 104 having a primary surface 105, a pad layer 106, a stopping layer 108, an etch-selectivity layer 110, and trenches 122, 124, and 126.

The underlying doped region 102 can be part of a substrate that may be lightly doped or heavily doped, n-type or p-type. For the purposes of this specification, heavily doped is intended to mean a peak dopant concentration of at least $10^{19}$ atoms/cm$^3$. The underlying doped region 102 can be a portion of a heavily doped substrate (e.g., a heavily n-type doped wafer) or may be a buried doped region overlying a base layer of opposite conductivity type or overlying a buried insulating layer (not illustrated) that lies between the base layer and the buried doped region. In an embodiment, the underlying doped region 102 is heavily doped with an n-type dopant, such as phosphorus, arsenic, antimony, or any combination thereof. In a particular embodiment, the underlying doped region 102 includes arsenic or antimony if diffusion of the underlying doped region 102 is to be kept low.

The semiconductor layer 104 overlies the underlying doped region 102 and can include a Group 14 element (for example, carbon, silicon, germanium, or any combination thereof) and any of the dopants as described with respect to the underlying doped region 102 or dopants of the opposite conductivity type. In an embodiment, the semiconductor layer 104 is a moderately doped n-type or p-type epitaxial silicon layer having a thickness in a range of approximately 0.5 microns to approximately 4.0 microns, and a doping concentration no greater than approximately $10^{18}$ atoms/cm$^3$, and in another embodiment, a doping concentration of at least approximately $10^{15}$ atoms/cm$^3$. The doping concentration and thickness can be adjusted to achieve a needed or desired breakdown voltage for the electronic device. The doping concentration of the semiconductor layer 104 at this point in the process flow and within approximately 1 micron of the primary surface 105 may be referred to as the background doping concentration. The primary surface 105 that is spaced apart from underlying doped region. The semiconductor layer 104 may include a single semiconductor layer or a plurality of discrete semiconductor layers. The doping concentration may be relatively higher near the underlying doped region 102 and relatively lower near the primary surface 105.

The pad layer 106, the stopping layer 108 (for example, a polish-stop layer or an etch-stop layer), and the etch-selectivity layer 110 are formed over the semiconductor layer 104 using a thermal growth technique, a deposition technique, or a combination thereof. The etch-selectivity layer 110 is optional and can help to protect the stopping layer 108 from being etched when forming the trenches 122, 124, and 126. Each of the pad layer 106, the stopping layer 108, and the etch-selectivity layer 110 can include an oxide, a nitride, an oxynitride, or any combination thereof. In an embodiment, the pad layer 106 has a different composition as compared to the stopping layer 108, and the stopping layer 108 has a different composition as compared to the etch-selectivity layer 110. In a particular embodiment, the pad layer 106 includes an oxide, the stopping layer 108 includes a nitride, and the etch-selectivity layer 110 includes a deposited oxide. Each of the pad layer 106, the stopping layer 108, and the etch-selectivity layer 110 can have substantially the same thickness or different thickness as compared to one another. Each of pad layer 106, stopping layer 108, and the etch-selectivity layer 110 can have a thickness in a range of approximately 30 nm to approximately 300 nm. The combined thickness of the pad layer 106, and stopping layer 108, and the etch-selectivity layer can be in a range of approximately 200 nm to 600 nm.

A patterned resist layer (not illustrated) is formed over the etch-selectivity layer 110, and the etch-selectivity layer 110, the stopping layer 108, and the pad layer 106 are etched, and the patterned resist layer is removed. The patterned resist layer, etch-selectivity layer 110, the stopping layer 108, or any combination thereof can be a hardmask during the trench etch. The semiconductor layer 104 is etched to define trenches 122, 124, and 126 that extend from the primary surface 105 towards the underlying doped region 102. The trenches 122 and 124 are within an active area where transistor structures will be formed, and the trench 126 is within a conductive electrode contact area where a contact will be formed for subsequently formed. The trenches 122, 124, and 126 may have the substantially the same depth or different depths. In an embodiment, each of the trenches 122, 124, and 126 has a depth in a range of approximately 1.1 microns to approximately 4.0 microns. When expressed as a percentage of the thickness of the semiconductor layer 104, the trenches can extend to a depth that is in a range of approximately 50% to approximately 100% of the thickness of the semiconductor layer 104.

The trenches 122, 124, and 126 can have the substantially the same width or different widths. In an embodiment, the trench 124 is wider than the trenches 122 and may be up to approximately two times wider than the trenches 122. In an embodiment, each of the trenches can have a width in a range of approximately 0.11 micron to approximately 0.9 micron. In an embodiment, the trenches 122 and 124 can have a width in a range of approximately 0.11 micron to approximately 0.5 micron, and the trench 126 can have a width in a range of approximately 0.3 to approximately 0.9 micron. In another embodiment, the trench 126 can have a width that is in a range of approximately 1.5 to 5 times the width of any of one of the trenches 122 and 124. The space between immediately adjacent trenches 122 and 124 can be in a range of approximately 0.11 micron to approximately 0.9 micron, and the space between the trench 126 and the nearest of trenches 122 and 124 can be in a range of approximately 1.1 microns to approximately 9 microns, or even greater. The cell pitch (for example, gate-to-gate) may be in a range of approximately 0.2 micron to 4.0 microns.

Many of the dimensions for the trenches and spaces between the trenches may be expressed as a multiple of design rules (such as the smallest feature size for the design rules or "F"). In an embodiment, each of the trenches can have a width in a range of approximately 1F to approximately 5F. In an embodiment, the trenches 122 and 124 can have a width in a range of approximately 1F to approximately 2.5F, and the trench 126 can have a width in a range of approximately 2F to 5F micron. The space between immediately adjacent trenches 122 and 124 can be in a range of approximately 1F to approximately 5F, and the space between the trench 126 and the nearest of trenches 122 and 124 can be in a range of approximately 3F to approximately 20F, or even greater. The cell pitch (for example, gate-to-gate) may be in a range of approximately 4F to approximately 9F.

Many other trenches 122 and 124 may be formed but are not illustrated in FIG. 1. The number of trenches 122 to the number of trenches 124 can be in a ratio in a range of approximately 0.75:1 to approximately 1.5:1. In a particular embodiment, the number of trenches 122 to trenches 124 may be in a ratio in a range of approximately 0.9:1 to approximately 1.1:1.

The etch-selectivity layer 110 may be removed at this time. If needed or desired, a thermal oxide may be grown and to help round the corners of the trenches 122, 124, and 126 near the primary surface 105 and bottoms of the trenches 122, 124, and 126. The thermal oxide can be removed. When the pad layer 106 includes an oxide, part of pad layer 106 may be etched, such that the stopping layer 108 is partly undercut as will be addressed below.

Figure 2:
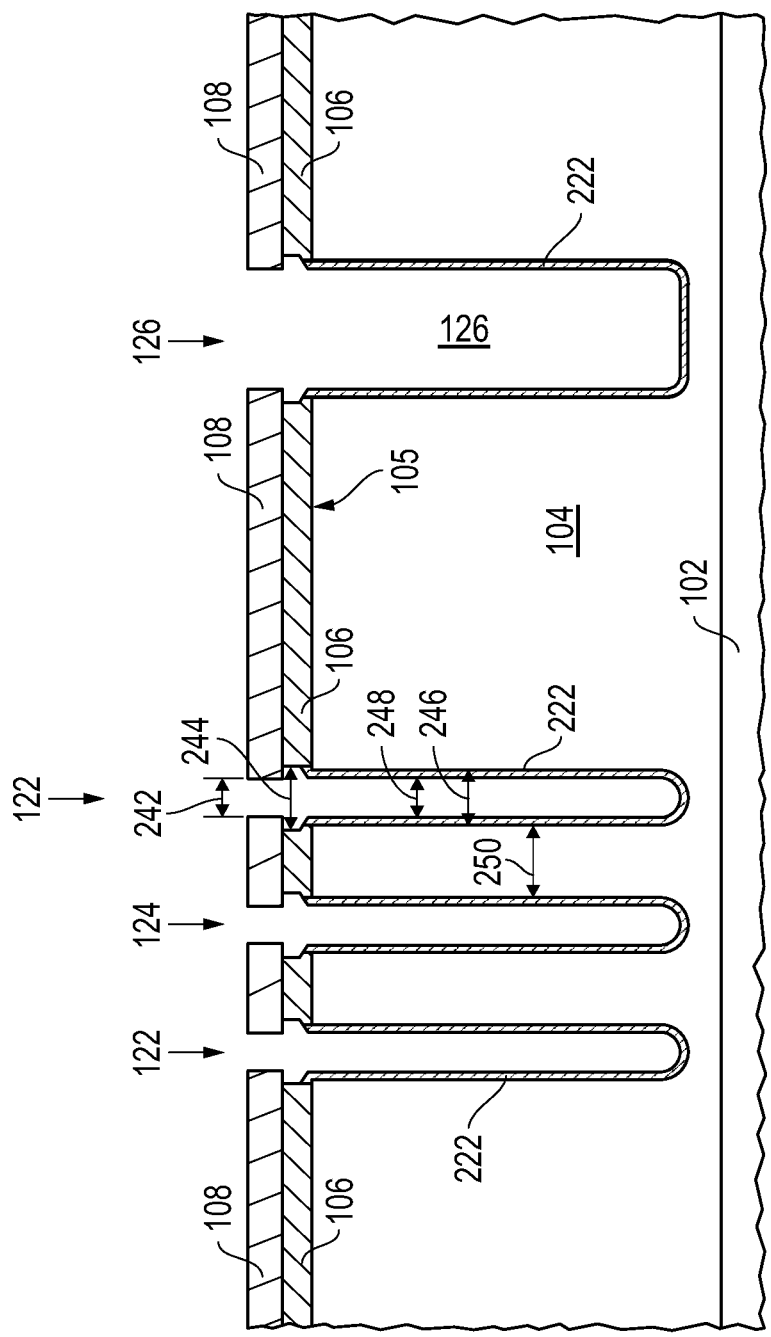
FIG. 2 includes an illustration of a cross-sectional view of the workpiece of FIG. 1 after forming trenches and an insulating layer within the trenches.

FIG. 2 includes an illustration of the workpiece after forming an insulating layer 222. The insulating layer 222 can include an oxide, a nitride, an oxynitride, or any combination thereof. In an embodiment, the insulating layer 122 can include a single film or a plurality of films (for example, an oxide film covered by a nitride film). The insulating layer 222 can have a thickness in a range of approximately 11 nm to approximately 70 nm. The insulating layer 222 can be formed using a thermal growth technique, a deposition technique, or a combination thereof.

Some of the widths of openings and trenches are addressed with respect to FIG. 2. Many of the widths are compared with the width 242 of one of openings corresponding to the stopping layer 108 corresponding to the trenches 122. Portions of the pad layer 106 under the stopping layer 108 have been removed near the trenches 122, 124, and 126 and have a width 244 as measured at the widest opening of the opening in the pad layer 106 corresponding to the trench 122. The width 244 can be in a range of approximately 0.02 micron to approximately 0.15 micron wider than width 242. Part of the semiconductor layer 104 has been consumed due to thermal growth operations and have a width 246, as defined by the sidewalls of the semiconductor layer 104, and in an embodiment may be no greater than approximately 0.09 micron wider than the width 242. The insulating layer 222 is disposed along the sidewalls of the semiconductor layer 104, and thus, the width 248 of the opening within the trench is approximately the width 246 minus twice the thickness of the insulating layer 222. The width 248 is at least as wide as the width 242. In an embodiment, the width 248 may be no greater than approximately 0.09 micron wider than the width 242. Width 250 corresponds to the distance between the trench 124 and an immediately adjacent trench 122, and in an embodiment is in a range of approximately 0.02 to 0.15 microns less than the original spacing between the same trenches. After reading this specification, skilled artisans will appreciate that the dimensions of the widths of features within other trenches, when compared to a corresponding opening of the stopping layer 108 for that particular corresponding trench can be substantially the same.

Figure 3:
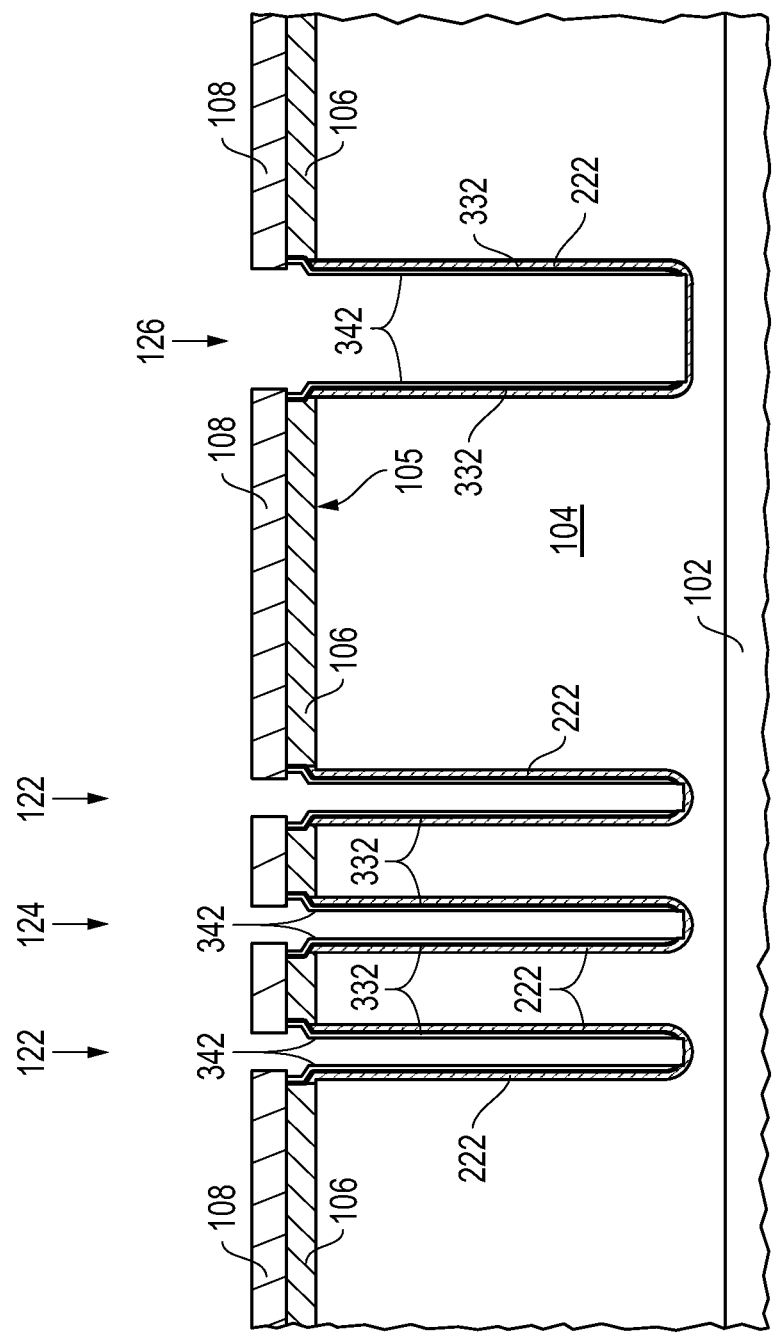
FIG. 3 includes an illustration of a cross-sectional view of the workpiece of FIG. 2 after forming oxidation-resistant and silicon spacers within the trenches.

FIG. 3 includes an illustration of a cross-sectional view after forming oxidation-resistant spacers 332 and silicon spacers 342. An oxidation-resistant layer can be formed over the stopping layer 108 and within the trenches 122, 124, and 126. The oxidation-resistant layer can include a nitride or an oxynitride and have a thickness in a range of approximately 5 nm to approximately 20 nm. An amorphous or polycrystalline silicon layer can be formed over the oxidation-resistant layer within and outside of the trenches 122, 124, and 126 and have a thickness in a range of approximately 7 nm to approximately 30 nm. The silicon and oxidation-resistant layers are anisotropically etched to remove portions of the silicon and oxidation-resistant layer over the stopping layer 108 and along bottoms of the trenches 122, 124, and 126 to form the oxidation-resistant spacers 332 and the silicon spacers 342.

Figure 4:
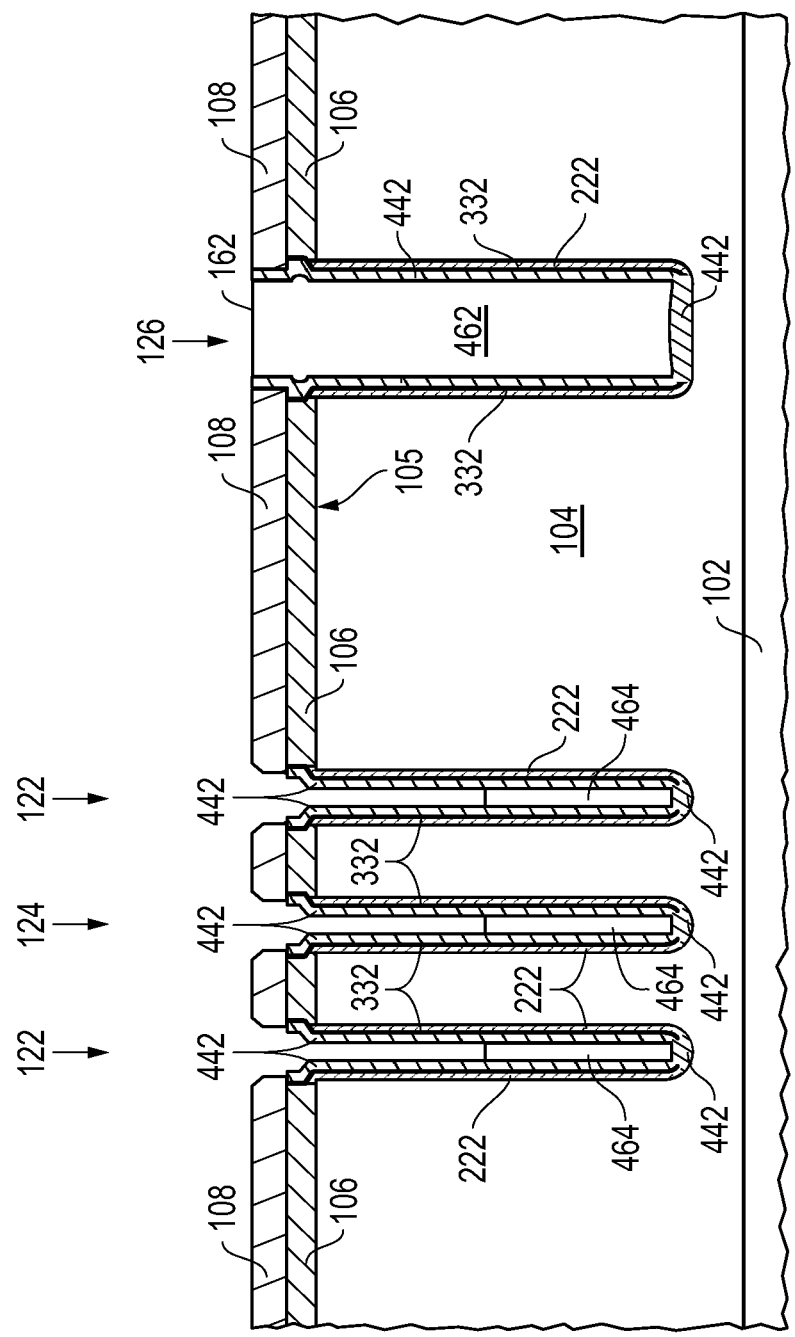
FIG. 4 includes an illustration of a cross-sectional view of the workpiece of FIG. 3 after forming conductive structures within the trenches.

A thermal oxidation is performed and can oxidize the silicon spacers 342 and portions of the semiconductor layer 104 along bottoms of the trenches 122, 124, and 126 to form the oxide layer 442, as illustrated in FIG. 4. Within the trenches 122, 124, and 126, the oxidation-resistant spacers 332 help to keep sidewalls of the semiconductor layer 104 from becoming further oxidized. In this manner, the oxide layer 422 can be made thicker along the bottoms of the trenches 122, 124, and 126. Along the oxidation resistant spacers 332, the oxide layer 442 can have a thickness in a range of approximately 15 nm to approximately 30 nm. Along the bottoms of the trenches 122, 124, and 126, the oxide layer 442 can have a thickness in a range of approximately 50 nm to approximately 200 nm. On a relative basis, the oxide layer 442 along the bottoms of the trenches 122, 124, and 126 can be in a range of approximately 1.5 to 5 times thicker than the oxide layer 442 along the oxidation-resistant spacers 332. The relatively thicker portion near the bottoms of the trenches 122, 124, and 126 help to reduce capacitive coupling between the underlying semiconductor layer 104 and conductive structures that will be formed within the trenches 122, 124, and 126.

A conductive layer is formed over the stopping layer 108 and fills remaining portions of the trenches 122, 124, and 126. The conductive layer can include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, or the like; the barrier film can include a refractory metal nitride, such as titanium nitride, tantalum nitride, or the like, a refractory silicide, such as tungsten silicide, titanium silicide, or the like, or a refractory metal-semiconductor-nitride, such as TaSiN; and the conductive fill material can include tungsten. In a more particular embodiment, the conductive layer can include Ti/TiN/W. The selection of the number of films and composition(s) of those film(s) depend on electrical performance, the temperature of a subsequent heat cycle, another criterion, or any combination thereof. Refractory metals and refractory metal-containing compounds can withstand high temperatures (e.g., melting points of such materials can be at least 1400° C.), may be conformally deposited, and have a lower bulk resistivity than heavily doped n-type silicon. After reading this specification, skilled artisans will be able to determine the composition of the conductive layer to meet their needs or desires for a particular application.

A portion of the conductive layer that overlies the stopping layer 108 outside of the trenches 112, 124, and 126 is removed to form conductive structures, substantially similar to the conductive structure 462 within the 126, as illustrated in the embodiment of FIG. 4. The removal can be performed using a chemical-mechanical polishing or blanket etching technique. The stopping layer 108 may be used as a polish-stop or etch-stop layer. A resist layer (not illustrated) is formed over the stopping layer 108 and conductive structure 462 and patterned to form a patterned resist layer overlies portions of the stopping layer 108, the trenches and conductive structures, such as the trench 126 and the conductive structure 462 outside the active area where transistor structures are being formed. The patterned resist layer has an opening over the active area.

The exposed portions of the conductive structures within the trenches 122 and 124 are recessed to form conductive structures 464 within the trenches 122 and 124, as illustrated in FIG. 4. The removal may be performed using a wet or dry etching technique. The patterned resist layer is then removed. Some of the exposed portions of the oxide layer 442 can be removed; however, the oxidation-resistant spacers 332 remain protected by remaining portions of the oxide layer 442. The highest elevations of the conductive structures 464 lie below an elevation generally corresponding to the primary surface 105. The tops of the conductive structures 464 can be approximately 0.6 micron to approximately 1.5 microns below the primary surface 105. When expressed as a percentage of a depth of a corresponding trench (that is, the trench in which a particular conductive structure is disposed), the conductive structures 464 can have depths in a range of approximately 10% to approximately 60% of the depths of the corresponding trenches. A combination of the conductive structures 462 and 464 can be parts of a conductive electrode to help deplete more fully the portions of semiconductor layer 104 between the trenches 122 and 124 within the active area.

Figure 5:
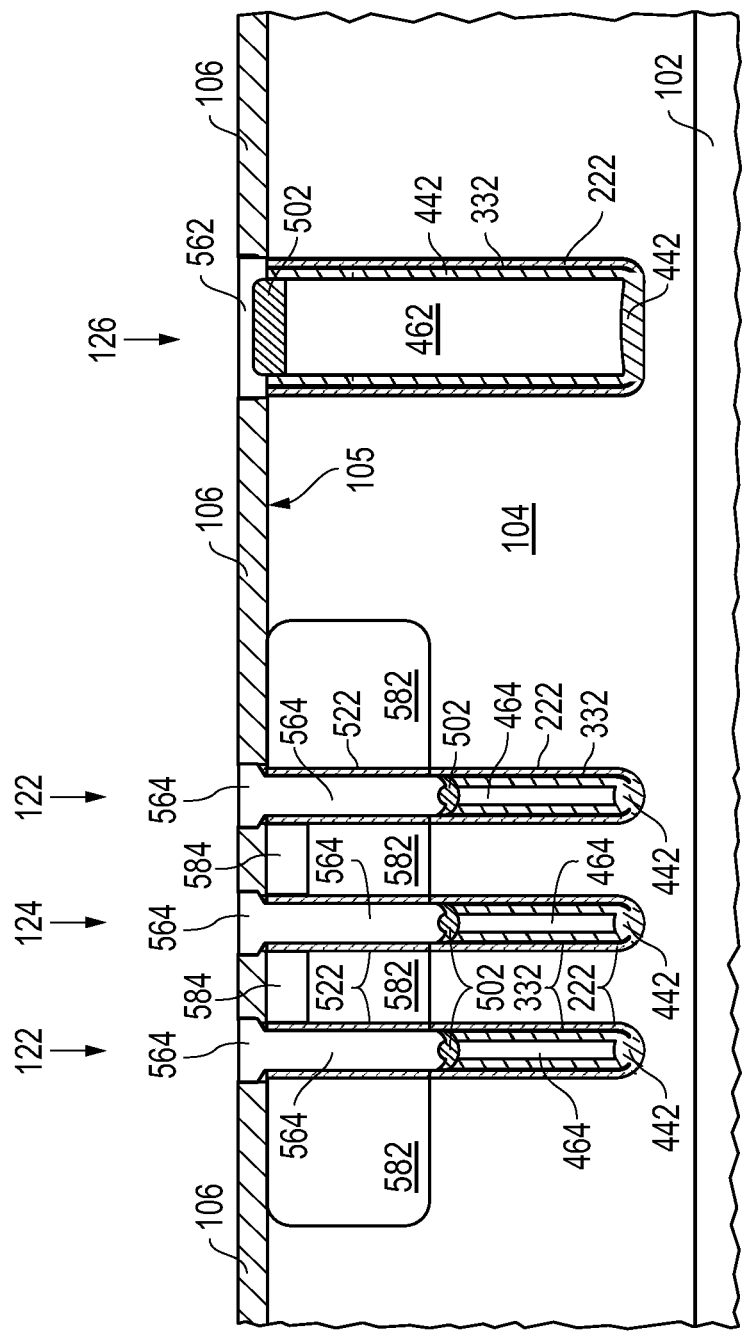
FIG. 5 includes an illustration of a cross-sectional view of the workpiece of FIG. 4 after forming insulating members, a gate dielectric layer, gate members, body regions, and source regions.

Insulating members 502 are formed over the conductive structures 462 and 464, as illustrated in FIG. 5. The insulating members 502 can include an oxide, a nitride, an oxynitride, or any combination thereof. The insulating members 502 can have a thickness in a range of approximately 20 to 300 nm. The insulating members 502 can be formed by a thermal growth or deposition process. The stopping layer 108, and portions of the oxide layer 442, and the oxidation-resistant spacers 332 are removed. The insulating layer 222 within the trenches 122 and 124 can be retained and used as the gate dielectric layer 522. In another embodiment, the insulating layer 222 can be partially or fully removed, and a gate dielectric layer 522 can be formed within the trenches 122 and 124. The gate dielectric layer 522 can have a thickness in a range of approximately 10 nm to approximately 70 nm and can be formed by a thermal growth, deposition process, or a combination of thermal growth and deposition.

A conductive layer is formed over pad layer 106 and insulating members 502 and along the gate dielectric layer 522 and fills remaining portions of the trenches 122 and 124 and the opening within the pad layer 106 adjacent to the trench 126. The conductive layer can include any of the materials, number of films, and be formed using any of the techniques previously described with respect to the conductive layer when forming the conductive structures 462. The conductive layer that is adjacent to the gate dielectric layer 522 may have the same or different composition, include the same number or a different number of films, or be formed with the same or different technique as compared to the conductive layer used to form the conductive structure 462. In a particular embodiment, the conductive structures 462 and 464 can be different parts of a single conductive structure, wherein the conductive 462 can be used as part of a contact to provide a voltage or other signal to the conductive structures 464 within the active area. After reading this specification, skilled artisans will be able to determine the composition of the conductive layer to meet their needs or desires for a particular application.

A portion of the conductive layer that overlies the pad layer 106 outside of the trenches 122, 124, and 126 is removed to form the gate members 564 within the trenches 122 and 124 and conductive structures 562 within the trench 126, as illustrated in the embodiment of FIG. 5. The removal can be performed using a chemical-mechanical polishing or blanket etching technique. The pad layer 106 may be used as a polish-stop or etch-stop layer. The gate members 564 can include gate electrodes for the transistor structures. As can be seen in FIG. 5 at this point in the process, the gate members 564 have a wider portion disposed at elevations above the primary surface 105 and a narrower portion disposed at elevations below the primary surface 105. In an embodiment, the wider portion is at least approximately 0.01 micron wider than the narrower portion, or at most approximately 0.04 micron wider than the narrower portion, and in another embodiment, the wider portion is no greater than approximately 0.20 micron, or no greater than approximately 0.09 micron wider than the narrower portion. The conductive structure 562 is an artifact of the processing sequence and can be removed at a later processing operation.

Body regions 582 and source regions 584 can be formed within the active area, as illustrated in FIG. 5. The body regions 582 include channel regions for the transistor structures. The body regions 582 have an opposite conductivity type as compared to the semiconductor layer 104. In an embodiment, within the active area, the elevations of the bottoms of the body regions 582 are above the elevations for lowermost points of the gate members 564. The body regions 582 have a peak dopant concentration in a range of approximately $5\times10^{16}$ atoms/cm$^3$ to approximately $1\times10^{18}$ atoms/cm$^3$ and extends to a depth approximately 0.2 microns to approximately 0.9 microns from the primary surface 105. The body regions 582 can be formed with a single implant or with a chain of implants. In another embodiment, the body regions 582 can be replaced with a single body region within the active area.

The source regions 584 are formed from portions of the semiconductor layer 104 and are disposed over portions of the body regions 582. The source regions 584 have the same conductivity type as compared to the semiconductor layer 104 and opposite that of the body regions 582. The source regions 584 have a peak dopant concentration of at least approximately $1\times10^{19}$ atoms/cm$^3$ and extends to a depth approximately 0.05 microns to approximately 0.5 microns from the primary surface 105. The source regions 584 can be formed with an implant or another suitable technique. In another embodiment, the source regions 584 can be replaced with a single source region within the active area. The source regions 584 may be formed before or after the body regions 582.

Figure 6:
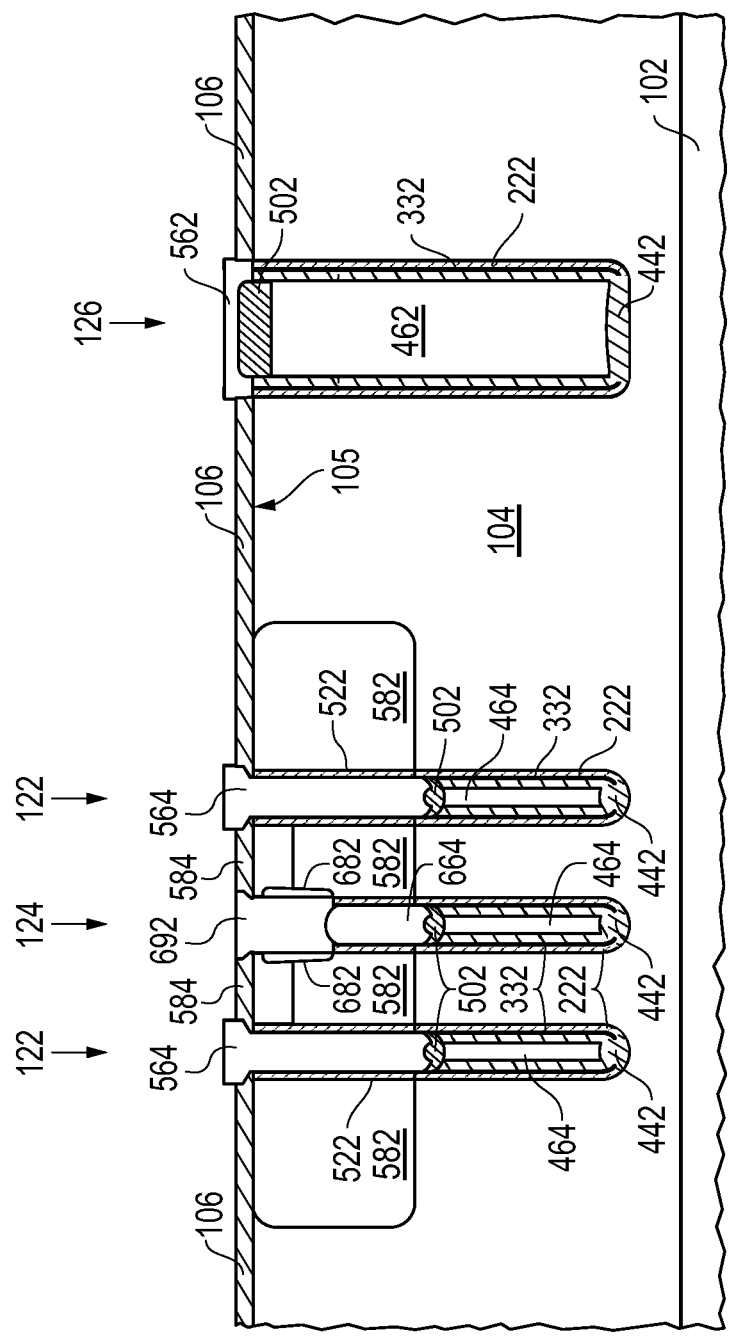
FIG. 6 includes an illustration of a cross-sectional view of the workpiece of FIG. 5 after recessing a conductive structure, forming body contact regions, and forming a conductive plug over the recessed conductive structure.

FIG. 6 includes an illustration of a cross-sectional view after forming a recessed conductive structure 664 and after forming body contact regions 682 and a conductive plug 692. Referring to FIG. 5, a patterned resist layer (not illustrated) is formed over the pad layer 106, the gate members 564 within trenches 122 and the conductive structure 562 within the trench 126. An opening defined by the patterned resist layer overlies the gate member 564 within the trench 122. A portion of the gate member 564 within the trench 124 is removed to form the recessed conductive structure 664, as illustrated in FIG. 6. A top elevation of the recessed conductive structure 664 lies at an elevation below the bottom of the source region 584 immediately adjacent to the trench 124. At this point in the process, the recessed conductive structure 664 is electrically insulated from the conductive structures 464 within the trenches 122 and 124, the conductive structure 462 within the trench 126, and the gate members 564 within the trenches 122. Many other gate members 564 and conductive structures, similar to the conductive structure 664, may be formed but are not illustrated in FIG. 6. The number of gate members 564 to the number of conductive structures, such as the conductive structure 664, can be in a ratio in a range of approximately 0.75:1 to approximately 1.5:1. In a particular embodiment, the number of gate members 564 to such conductive structures may be in a ratio in a range of approximately 0.9:1 to approximately 1.1:1.

The body contact regions 682 can be formed using a tilt angle implant or from a deposited dopant diffusion source such as doped glass or doped silicon. The body contact regions 682 may be implanted with a dopant having the same conductivity type as the body regions 582 in which they reside. The body contact regions 682 are heavily doped so that an ohmic contact can be subsequently formed. If needed or desired, exposed portions of the regions, structures, and members may be silicided. A gate feed area (not illustrated) and the conductive electrode feed area can be covered with resist when forming the body contact regions 682, and the resist can be removed after the body contact regions 682 are formed. The patterned resist layer is removed. A portion of the pad layer 106 and exposed portions of the gate dielectric members 522 within the trench 124 are removed using an isotropic etching technique. At this point in the process, portions of the source region 584 and the body contact regions 682 adjacent to the trench 124 are exposed.

The conductive plug 692 can be formed by depositing a conductive layer and etching portions of the conductive layer outside the trench 124 and opening in the pad layer 106. The conductive layer for the conductive plug 692 can include any of the materials, films, or both as described with respect to the conductive layer for the conductive structure 462. In an embodiment, the conductive layer for the conductive plug 692 has a different composition or a different number of films as compared to the conductive structure 462. In another embodiment, the conductive layer for the conductive plug 692 has substantially the same composition and same number of films as compared to the conductive structure 462. After removing portions of the conductive layer lying outside the trench 124 and opening in the pad layer 106, the conductive plug 692 is formed. Other conductive plugs may be formed but are not illustrated in FIG. 6. The conductive plug 692 electrically shorts the source regions 584, the body contact regions 682, and the conductive member 664 to one another.

After forming the conductive plug 692, the conductive structure 562 (overlying the conductive structure 462 within the trench 126) is removed. The gate members 564 may be recessed further within the trenches 122, as illustrated within FIG. 7. In an embodiment, the tops of the gate members 564 are recessed approximately 0.03 micron to approximately 0.3 micron below the primary surface 105. By recessing the gate members 564, the capacitive coupling between the gate members 564 and the source regions 584 can be reduced, and thus, the source component ($Q_{GS}$) of $Q_G$ is reduced. Elevations of the tops of the gate members 564 are between elevations corresponding to the junction between the body regions 582 and the source regions 584 and an elevation generally corresponding to the primary surface 105. In the embodiment as illustrated in FIG. 7, the gate members 564 span substantially all of the channel lengths of the transistor structures, wherein the channel lengths extend from the junctions of the source regions 584 and the body regions 582 to the junctions of the body regions 582 and the semiconductor layer 104.

Figure 7:
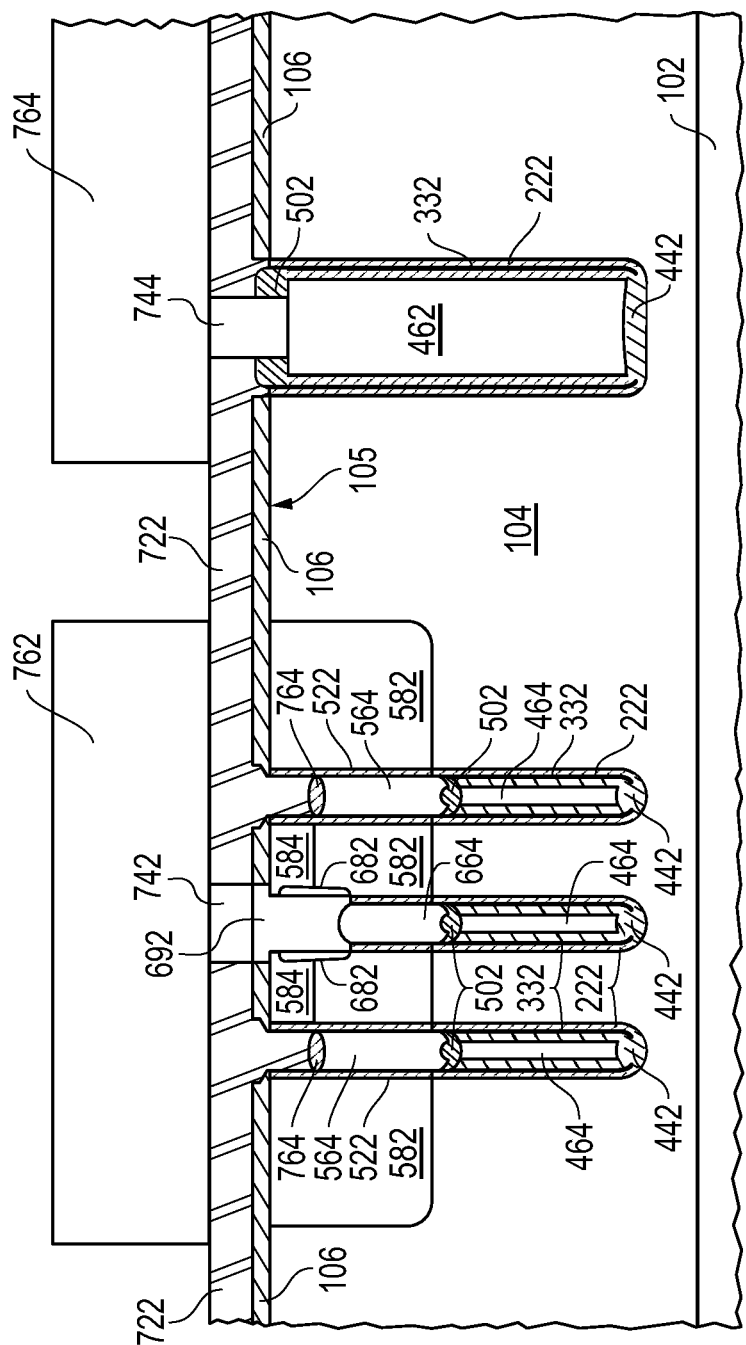
FIG. 7 includes an illustration of a cross-sectional view of the workpiece of FIG. 6 after forming a substantially completed electronic device.

FIG. 7 further includes an illustration of a substantially completed electronic device. Silicide regions 764 may be formed from a portion of or over the gate members 564. The silicide regions 764 may be omitted if needed or desired. An interlevel dielectric ("ILD") layer 722 is formed and etched to define contact openings. The ILD layer 722 can include an oxide, a nitride, an oxynitride, or any combination thereof. The ILD layer 722 can include a single film having a substantially constant or changing composition (e.g., a high phosphorus content further from the semiconductor layer 105) or a plurality of discrete films. An etch-stop layer, an antireflective layer, or a combination may be used within or over the ILD layer 722 to help with processing. The ILD layer 722 may be planarized to improve process margin during subsequent processing operations (e.g., lithography, subsequent polishing, or the like). In an embodiment, the ILD layer 722 has a thickness in a range of approximately 300 nm to approximately 1000 nm. The ILD layer 722 can be planarized using an etchback or polishing technique.

The ILD layer 722 is patterned to define contact openings that extend through the ILD layer 722. The contact openings extend to the conductive plug 692 within the active area, and through the insulating member 502 to the conductive structure 462 within the conductive electrode contact area. Although not illustrated, another contact opening extends through the ILD layer 722 to a conductive structure within a gate contact area that is electrically connected to or part of the gate members 564.

Conductive plugs 742 and 744 are formed by depositing a conductive layer and etching portions of the conductive layer outside the contact openings that extend through the ILD layer 722. The conductive layer for the conductive plugs 742 and 744 can include any of the materials, films, or both as described with respect to the conductive layer for the conductive structure 462. In an embodiment, the conductive layer for the conductive plugs 742 and 744 have a different composition or a different number of films as compared to the conductive structure 462. In another embodiment, the conductive layer for the conductive plugs 742 and 744 have substantially the same composition and same number of films as compared to the conductive structure 462. After removing portions of the conductive layer lying outside the contact openings, the conductive plugs 742 and 744 are formed. Other conductive plugs may be formed but are not illustrated in FIG. 7.

An interconnect level can be formed and include interconnect members 762 and 764. In the embodiment as illustrated in FIG. 7, the interconnect member 762 directly contacts and is electrically connected to the conductive plug 742, which is electrically connected to the source regions 584, body contact regions 682, and the recessed conductive structure 664 through the conductive plug 692. In the embodiment as illustrated in FIG. 7, the interconnect member 764 within the conductive electrode contact area directly contacts and is electrically connected to the conductive plug 744, which in turn is electrically connected to the conductive structure 462 within the conductive electrode contact area and to the conductive structures 464 within the active area. Although not illustrated, another interconnect member may be formed at the current interconnect level or at a subsequent interconnect level, where such other interconnect member is electrically connected to the gate members 564. A drain contact may be formed to the backside of the workpiece to underlying doped region 102 or may be formed near the primary surface 105 if a topside contact is desired.

The interconnect members 762 and 764 can be formed from a conductive layer that can include any of the materials, number of films, and be formed using any of the techniques previously described with respect to the conductive layer when forming the conductive structures 462. In an embodiment, the conductive layer for the conductive interconnect members 762 and 764 has a different composition or a different number of films as compared to the conductive structure 462. In another embodiment, the conductive layer for the interconnect members 762 and 764 has substantially the same composition and same number of films as compared to the conductive structure 462. In another embodiment, the conductive layer for the interconnect members 762 and 764 has a different composition or a different number of films as compared to the conductive structure 462. In another embodiment, the conductive layer for the interconnect members 762 and 764 can principally include aluminum, copper, or a noble metal. The thickness of the conductive layer can be in a range of approximately 0.5 micron to approximately 5.0 microns. The interconnect members 762 and 764 can be formed using an in-laid technique or using a resist layer and a lithographic technique.

The interconnect member 762 can be electrically connected to a source terminal, which during normal operation may be at $V_{SS}$ or approximately ground potential. The interconnect member 764 can be electrically connected to a substantially constant voltage terminal, which during normal operation may be at $V_{SS}$, $V_{DD}$ for logic transistors (e.g., higher than $V_{SS}$ and no greater than approximately 5 V), or ground potential. When the interconnect members 762 and 764 are to be at the same potential during normal operation, the interconnect members 762 and 764 can be electrically connected to each other or may be replaced by a single interconnect member having different portions within the active area and the conductive electrode area. Another interconnect member (not illustrated) that is electrically connected to the gate members 564 can be electrically connected to a gate terminal or a gate controller within the electronic device.

The electronic device can include many transistor structures substantially similar to the transistor structures illustrated in FIG. 7 with the transistor structures connected in parallel with their corresponding gate members connected to the gate terminal or gate controller. All of the transistor structures can be power transistors.

Figure 8:
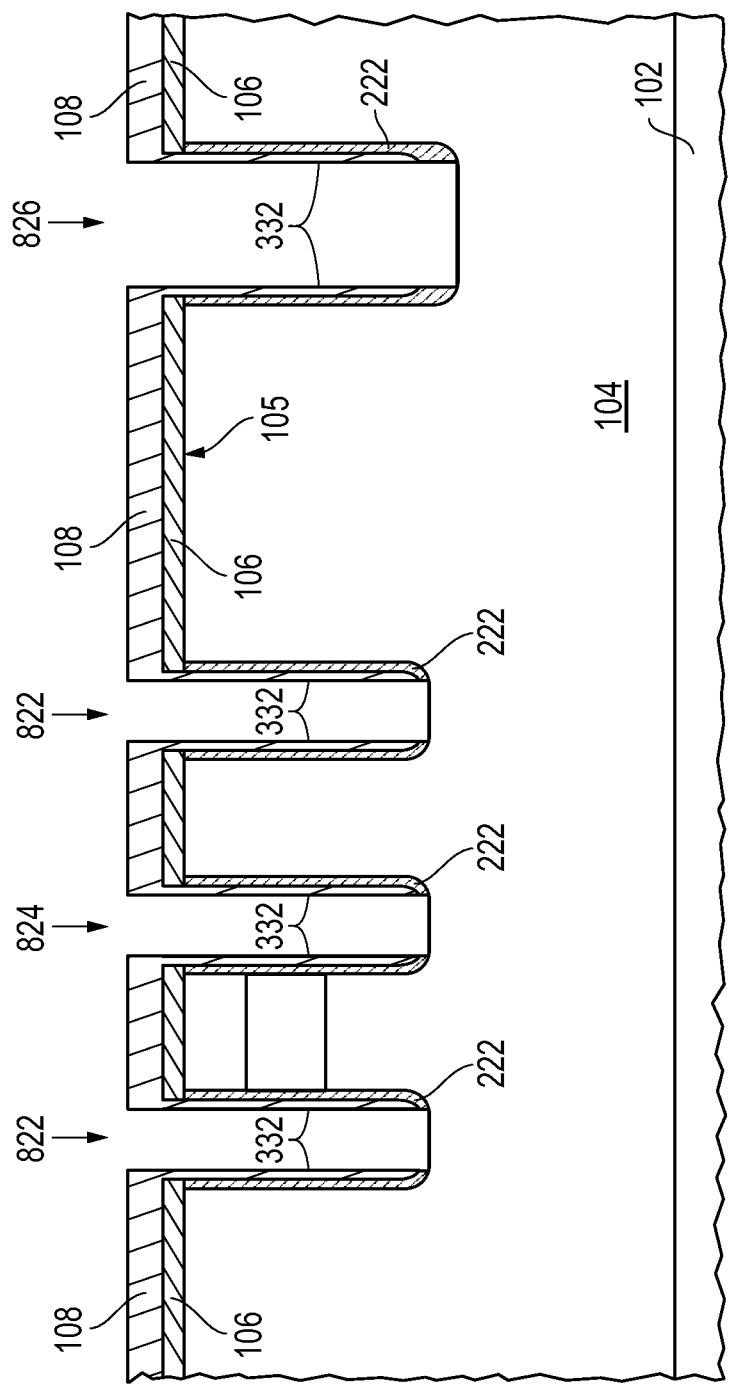
FIG. 8 includes an illustration of a cross-sectional view of a portion of a workpiece after forming trenches, an insulating layer, and oxidation-resistant spacers in accordance with an alternative embodiment.

In another embodiment, two-part trenches can be formed. In the embodiment as illustrated in FIG. 8, trenches 822, 824, and 826 are formed similar to the process illustrated and described with respect to FIGS. 1 to 3; however, the trenches 822, 824, and 826 are shallower than the trenches 122, 124, and 126 and may be about half the depth as described with respect to the trenches 122, 124, and 126. In the particular embodiment illustrated, the silicon layer 342 (as described with respect to FIG. 3) is not formed and oxidized, and the insulating layer 222 is removed from the bottoms of the trenches 822, 824, and 826. In another embodiment, any of the pad layer undercut or silicon layer 342 and subsequent oxidation to form oxide layer 442 may be performed if needed or desired.

Figure 9:
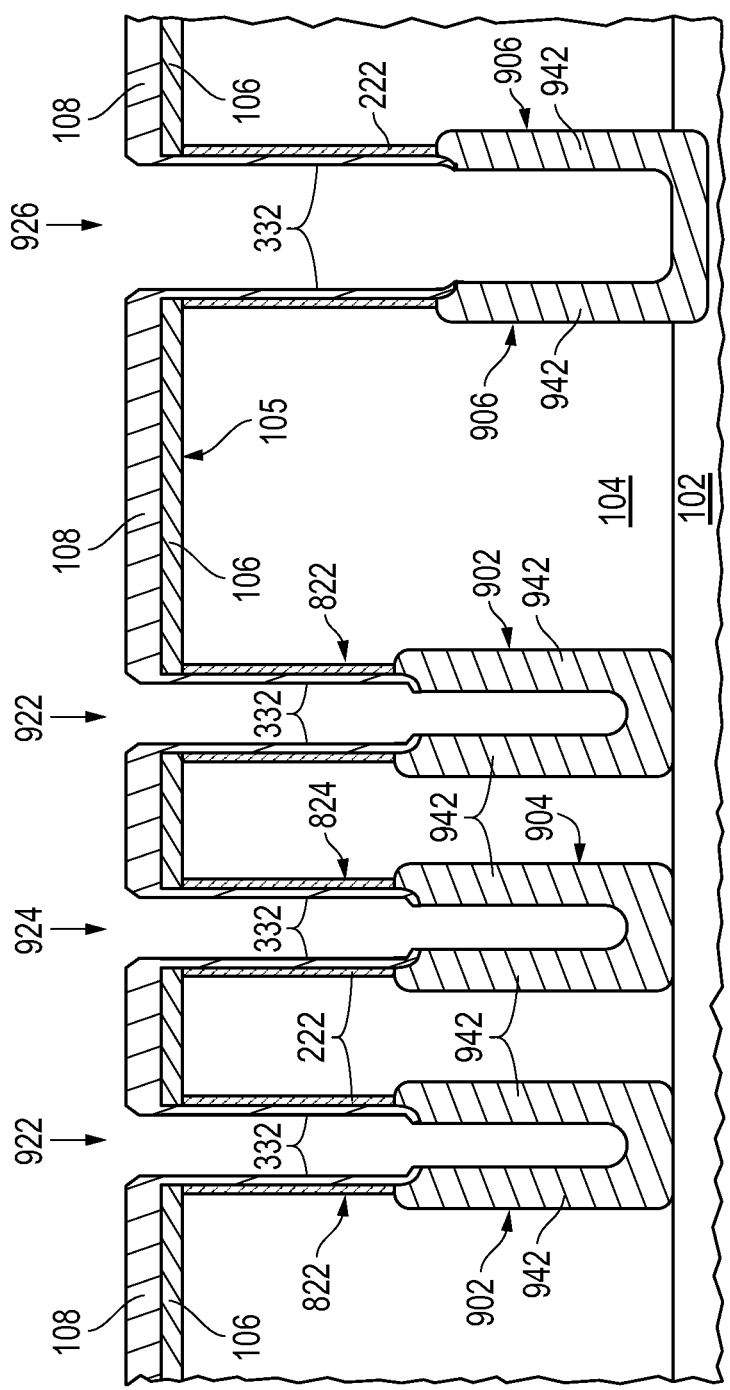
FIG. 9 includes an illustration of a cross-sectional view of the workpiece of FIG. 8 after extending and forming wider portions of the trenches and an insulating layer within the wider portions of the trenches in accordance with the alternative embodiment.

FIG. 9 includes an illustration after forming trenches 922, 924, and 926 and an insulating layer 942. An etch can be performed to extend the trenches closer to or extend into the underlying doped region 102. After extending the trenches, part of the semiconductor layer 104 can be removed to form wider bottom portions 902, 904, and 906 of the trenches 922, 924, and 926 that are defined at least in part by the sidewalls of the semiconductor layer 104, as illustrated in FIG. 9. The wider portions can be achieved by an isotropic etch, thermally growing a layer, such as the insulating layer 942, or a combination thereof. In an embodiment, a sacrificial layer can be grown from the semiconductor layer 104 and etched away. In an embodiment, the bottom portions 902, 904, and 906 can be at least approximately 0.02 micron, at least approximately 0.03 micron, or at least approximately 0.06 micron wider than the trenches 822, 824, and 826 in FIG. 8. In another embodiment, the bottom portions 902, 904, and 906 may be no greater than approximately 0.30 micron, no greater than approximately 0.20 micron, or no greater than approximately 0.15 micron wider than the trenches 822, 824, and 826 in FIG. 8.

The insulating layer 942 is formed along the bottom portions 902, 904, and 906 of the trenches 922, 924, and 926. The insulating layer 942 can include an oxide, a nitride, an oxynitride, or any combination thereof. The insulating layer 942 can be formed to a thickness, such that the bottom portions 902, 904, and 906 are not completely filled and subsequently formed conductive members formed within the bottom portions 902, 904, and 906 have sufficiently low capacitive coupling to the underlying doped region 102. The insulating layer 942 can have a thickness in a range of approximately 50 nm to approximately 200 nm. The thickness can be increased further to increase the breakdown voltage capability, if needed or desired. The insulating layer 942 can be formed by a thermal growth. At this point, processing may be continued as previously described.

Figure 10:
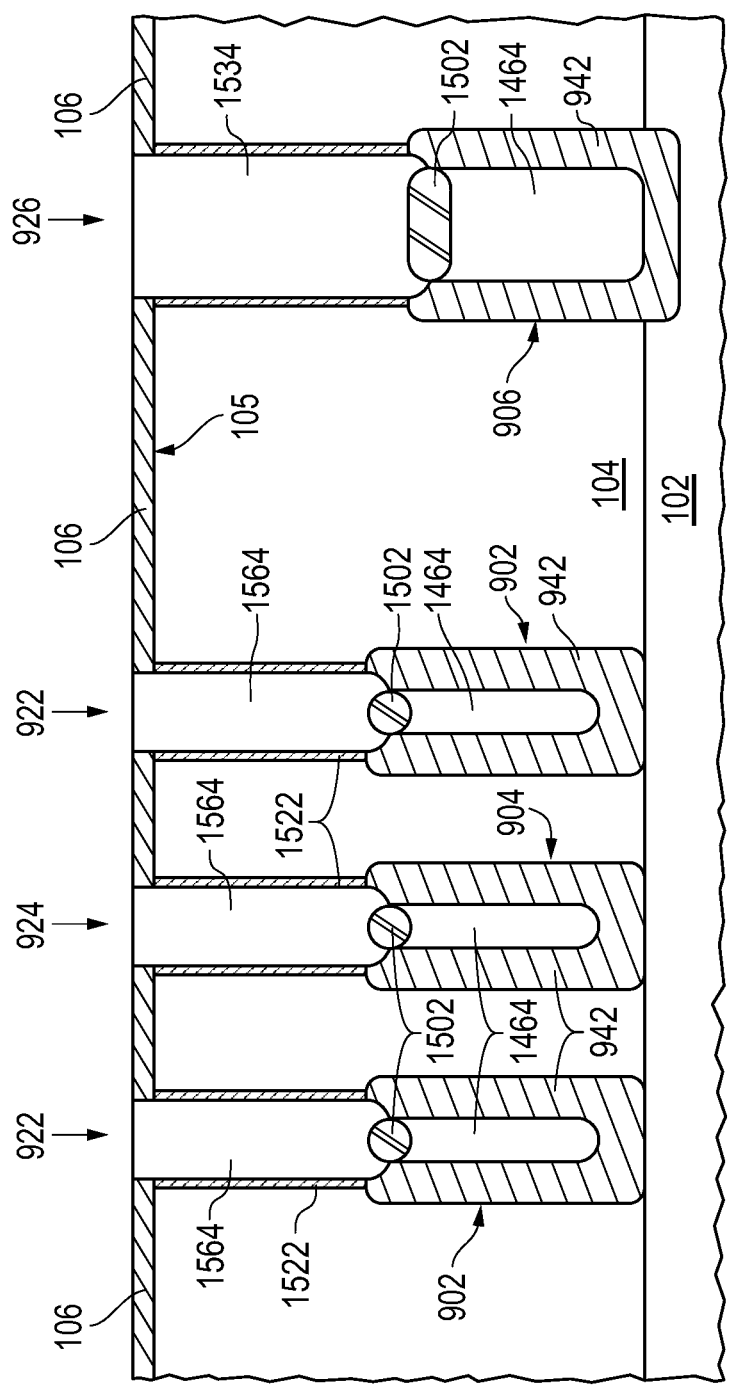
FIG. 10 includes an illustration of a cross-sectional view of the workpiece of FIG. 9 after a set of conductive structures, insulating members, and another set of conductive structures in accordance with the alternative embodiment.

Processing may be continued to form the workpiece as illustrated in FIG. 10. Conductive structures 1464 fill remaining portions of the bottom portions 902, 904, and 906 of the trenches 922, 924, and 926. In particular, the trench 926 includes the conductive structures 1464 that does not substantially fill a remaining portion of the trench 926, unlike the conductive structure 462 substantially filling a remaining portion of the trench 126, as illustrated in FIG. 4. The conductive structures 1464 can be formed using any of the embodiments as previously described with respect to the conductive structures 464.

Insulating members 1502 can be formed over the conductive structures 1464. The insulating members 1502 can be formed using any of the embodiments as previously described with respect to the insulating members 502. The stopping layer 108, the oxidation-resistant spacers 332, and the insulating layer 222 are removed, and a gate dielectric layer 1522 is formed within the upper portions of the trenches 922, 924, and 926. The gate dielectric layer 1522 can be formed using any of the embodiments as previously described with respect to the gate dielectric layer 522.

Conductive structures 1534 and gate members 1564 can be formed over the insulating layer 1502. The conductive structure 1534 within the trench 924 will be subsequently recessed and electrically connected to subsequently-formed source and body contact regions. The gate members 1564 can include gate electrodes for transistor structures being formed. With respect to trench 926, an opening (not illustrated) can be formed that extends completely through the conductive structure 1534 and the insulating layer 1502 and partly through the conductive structure 1464, and the opening can be filled with a conductive plug (not illustrated) that directly contacts the conductive structures 1534 and 1464 within the trench 926. The conductive plug can be formed when forming contact openings through a subsequently formed ILD layer (not illustrated) or at another time in the process. The conductive plug can be formed using any of the embodiments as described with respect to the conductive plug 744. Thus, an electrical connection from the top side of the die can be made to the conductive structures 1534 within the trenches 924 and 926.

Subsequent processing can be performed in a similar manner using any of the embodiments as described or illustrated in FIGS. 6 and 7 or potential with modifications.

The embodiments as described in FIGS. 1 to 7 may be modified so that the conductive structure 462 within the trench 126 is replaced by a combination of a conductive structure 464, the insulating members 502 and another conductive structure similar to gate member 564 within the trench 124, as illustrated in FIG. 5. Thus, the wider bottom portions of the trenches are not required for a pair of conductive structures as illustrated with respect to the trench 962 in FIG. 10. In still another embodiment, the combination of the conductive structures 1464 and 1534 can be replaced by a conductive structure similar to the conductive structure 462 in FIG. 4.

Figure 11:
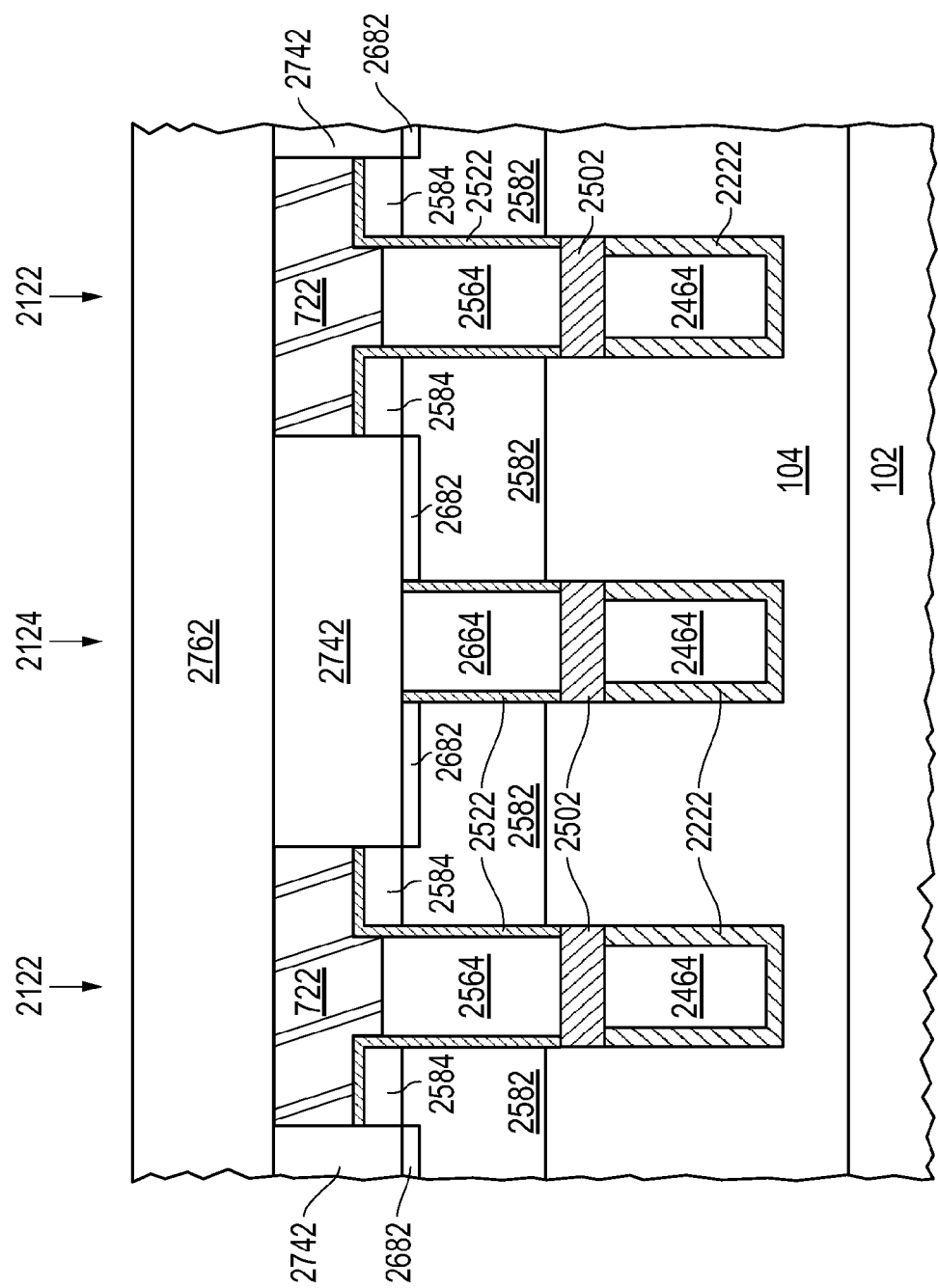
FIG. 11 includes an illustration of a cross-sectional view of a portion of a workpiece wherein body contact regions are formed along a horizontal surface in accordance with the alternative embodiment.

In embodiments previously described, the body contact regions are disposed along vertical surfaces (generally orthogonal to the primary surface 105) and not along horizontal surfaces (substantially along or generally parallel to the primary surface 105). In a further embodiment, the body contact region can be disposed along a horizontal surface, as illustrated in FIG. 11. FIG. 11 includes an illustration of a portion of a workpiece within the active area. The workpiece includes the underlying doped region 102, the semiconductor layer 104, trenches 2122 and 2124 within the semiconductor layer 104, an insulating layer 2222 along sidewalls and bottoms of lower portions of the trenches 2122 and 2124, conductive structures 2464 within lower portions of the trenches 2122 and 2124, insulating members 2502 overlying the conductive structures 2464 and within the trenches 2122 and 2124, a gate dielectric layer 2522 along sidewalls of upper portions of the trenches 2122 and 2124 and extending outside the trenches 2122, gate members 2564 within the upper portions of the trenches 2122, a conductive structure 2664 within an upper portion of the trench 2124, and body regions 2582 formed within the semiconductor layer 104 and adjacent to the upper portions of the trenches 2122 and 2124.

The trenches 2122 and 2124 can be formed using any of the embodiments as previously described with respect to the trenches 122 and 124. The insulating layer 2222 can be formed using any of the embodiments as previously described with respect to the insulating layer 222. The conductive structures 2464 can be formed using any of the embodiments as previously described with respect to the conductive structures 464. The insulating members 2502 can be formed using any of the embodiments as previously described with respect to the insulating members 502. The gate members 2564 can be formed using any of the embodiments as previously described with respect to the gate members 564. The conductive structure 2664 is initially formed substantially similar to the gate members 2564. The body regions 2582 are formed substantially similar to the body regions 582.

Before forming source regions 2584, the semiconductor layer 104 extends to the gate dielectric layer 2522 at locations outside the trenches 2122 and 2124. The source regions 2584 are formed from portions of the semiconductor layer 104 using any of the embodiments as previously described with respect to the source regions 584. The ILD layer 722 is formed over the exposed surface of the workpiece and patterned to remove portions of the ILD layer 722 overlying the gate members 2564 and portions but not all of the source regions 2584. Portions of the gate dielectric layer 2522, source regions 2584, and conductive structure 2644 within or adjacent to the trench 2124 are etched. The etching may continue into the body regions 2582 to ensure the depths of the openings extend beyond the junctions of the source regions 2584 and the body regions 2582.

The body contact regions 2682 can be formed along exposed portions of the body regions 2582, and in the embodiment as illustrated in FIG. 11, are along horizontal surfaces. The body contact regions 2682 can be formed by implantation or doping from a solid or gaseous source. Implantation may or may not be performed at a tilt angle. When doping using a solid or gaseous doping source, insulating spacers may be formed along the sides of the opening to reduce the likelihood of counter doping the source regions 2584. If needed or desired, the top of the conductive structure 2664 may be protected during the doping operation. If insulating spacers were formed, they can be removed with an isotropic etch. Further, if needed or desired, portions of the ILD layer 722 and the gate dielectric layer 2522 may be etched to expose parts of the top surfaces of the source regions 2584, which may help with subsequent electrical connections that are formed. If a resist layer was used for patterning, it can be removed at this time.

Conductive plugs 2742 are formed within the openings, and an interconnect member 2762 is formed over the conductive plugs 2742 and the ILD layer 722. The conductive plugs 2742 electrically short the source regions 2584, the body contact regions 2682, and the conductive structure 2664 to one another. The conductive plugs 2742 can be formed using any of the embodiments as previously described with respect to the conductive plugs 742, and the interconnect member 2762 can be formed using any of the embodiments as previously described with respect to the interconnect member 762. Although not illustrated, subsequent processing can be performed as previously described.

As compared to the embodiments in FIGS. 1 to 10, the embodiment as illustrated in FIG. 11 more readily allows a variety of doping techniques in forming the body contact regions 2682 due at least in part to forming the body contact regions 2682 along horizontal surfaces. This particular embodiment may have a larger cell pitch as compared to the embodiments of FIGS. 1 to 10 because the body contacts regions 2682 are formed along horizontal surfaces. The embodiments in FIGS. 1 to 10 may have smaller cell pitches. The body contact regions 682 in the prior embodiments can be formed using a solid or gaseous dopant source; however, some processing may need to be changed to substantially prevent or reduce the effects of counter doping the source regions 584, to allow horizontal surfaces of the of the source regions 584 to become exposed, or a combination thereof. After reading this specification, skilled artisans will be able to use the concepts described herein for their particular device designs and applications.

The electronic devices as described herein can allow a plurality of conductive structures in the trenches 124 and 2124 allow the cell pitch to decrease. As the cell pitch decreases, the concentration of the semiconductor layer 104 can be increased that reduces $R_{DSON}$. The gate members 564, 1564, and 2564 reside in every other trench within the active area, so $Q_G$ is reduced as compared to an electronic device in which all trenches include gate members. Thus, the electronic device has a good figure of merit ($R_{DSON}*Q_G$) as compared to conventional trench MOSFETs.

Embodiments as described herein can allow the conductive structures 664 and 2664 to be processed more similar to the gate members 564 and 2564 during initial formation of the conductive structures 664 and 2664. Thus, the conductive structures 664 and 2664 can be electrically insulated from the underlying conductive structures 464 and 2464 until conductive plugs and interconnect members are formed. The top side contacts to the conductive structures 664 and 2664 within the active region are simplified because direct contact can be made to the same conductive plug that also contacts the source regions 584 and 2584 and the body contact regions 682 and 2682. The conductive structures within the same trench 124 and 2124 may be electrically connected to each other outside of the same trench, such as with one or more interconnect members. Therefore, the formation sequence may be simplified and may use fewer masking operations.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device comprising a transistor structure can include a patterned semiconductor layer overlying a substrate and having a primary surface, wherein the patterned semiconductor layer defines a first trench and a second trench that extend from the primary surface towards the substrate. The electronic device can further include first conductive structures within each of the first and second trenches, and a gate electrode within the first trench and electrically insulated from the first conductive structure, a first insulating member disposed between the gate electrode and the first conductive structure within the first trench. The electronic device can still further include a second conductive structure within the second trench, wherein the second conductive structure is electrically connected to the first conductive structures and is electrically insulated from the gate electrode; and a second insulating member disposed between the second conductive structure and the first conductive structure within the second trench.

In an embodiment of the first aspect, the electronic device further includes a source region within the patterned semiconductor layer, and wherein from a top view, the source region is disposed between the first and second trenches; and a body contact region within the patterned semiconductor layer and between the first and second trenches. In a particular embodiment, the source region is disposed over substantially all of the body contact region. In another particular embodiment, the body contact region is disposed along a lateral surface of the second trench. In another embodiment, the electronic device further includes other first trenches substantially identical to the first trench, other gate electrodes within the other first trenches, other second trenches substantially identical to the second trenches, and other second conductive structures within the other second trenches. A ratio of a first number of gate electrodes to a second number of second conductive structures is in a range of approximately 0.75:1 to approximately 1.5:1.

In a further embodiment of the first aspect, the electronic device further includes other first trenches substantially identical to the first trench, other gate electrodes within the other first trenches, other second trenches having different widths as compared to each other, and other second conductive structures within the other second trenches. A ratio of a first number of gate electrodes to a second number of second conductive structures is in a range of approximately 0.75:1 to approximately 1.5:1. In still a further embodiment, in a direction substantially orthogonal to a channel length, the second conductive structure is wider than the first conductive structure within the second trench. In yet another further embodiment, in a direction substantially orthogonal to a channel length, the second conductive structure is narrower than the first conductive structure within the second trench.

In another embodiment of the first aspect, from a cross-sectional view, within the first and second trenches: the first conductive structures have substantially a same composition and dimensions, the first and second insulating members have substantially a same composition and dimensions, the gate electrode and the second conductive structure have substantially a same composition, bottom portions of the gate electrode and the second conductive structure have substantially identical bottom surfaces, and an uppermost point of the gate electrode lies at a first elevation, and an uppermost point of the second conductive structure lies at a second elevation, wherein the primary surface generally corresponds to a third elevation that is closer to the first elevation than the second elevation.

In a second aspect, a process of forming an electronic device can include forming a semiconductor layer over a substrate, wherein the semiconductor layer has a primary surface;

patterning the semiconductor layer to define a first trench and a second trench that extend from the primary surface towards the substrate. The process can further include forming first conductive structures within the first and second trenches, forming a first insulating member within the first trench after forming the first conductive structures, and forming a gate electrode within the first trench, wherein within the first trench, the first insulating member is disposed between the gate electrode and the first conductive structure. The process can still further include forming a second insulating member within the second trench after forming the first conductive structures, and forming a second conductive structure, wherein within the second trench, the second insulating member is disposed between the second conductive structure and the first conductive structure.

In an embodiment of the second aspect, forming the first insulating member and forming the second insulating member are performed substantially simultaneously. In another embodiment, the process further includes forming an oxidation-resistant layer within the first and second trenches, removing portions of the oxidation-resistant layer along bottoms of the first and second trenches to form an oxidation-resistant spacers, and thermally oxidizing the semiconductor layer along bottoms of the first and second trenches while the oxidation-resistant spacers are within the first and second trenches. Within a finished electronic device, oxide layers within the first and second trenches are thicker along between the first conductive structures and the bottoms of the first and second trenches as compared to the oxide layers between the first conductive structures and the sidewalls of the first and second trenches. In a particular embodiment, the process further includes depositing a silicon layer within the first and second trenches after removing the portions of the oxidation-resistant layer and before forming the first conductive structures. In another particular embodiment, the process further includes removing further portions of the oxidation-resistant spacers from within the first and second trenches at elevations above the first conductive structures, wherein remaining portions of the oxidation-resistant spacers are disposed between the first conductive structures and the sidewalls of the first and second trenches.

In a further embodiment of the second aspect, forming the gate electrode and forming the second conductive structure include depositing a conductive layer within the first and second trenches after forming the first insulating member and forming the second insulating member, removing portions of the conductive layer overlying the primary surface of the first and second trenches, and recessing the conductive layer within the second trench such that substantially all of a remaining portion of the conductive layer within the second trench has an uppermost point that is below an elevation that generally corresponds to the primary surface. In still a further embodiment, the gate electrode includes a gate member that includes a narrower portion disposed within the first trench and a wider portion that lies at an elevation above the primary surface.

In another embodiment of the second aspect, the process further includes forming a body region within the semiconductor layer and adjacent to the first and second trenches, forming a source region adjacent to the first trench after forming the gate electrode and before completing formation of the second conductive structure, and forming a body contact region after completing formation of the second conductive structure. In a particular embodiment, forming the body contact region includes doping a portion of the semiconductor layer such that the body contact region is disposed along a lateral surface of the semiconductor layer. In another particular embodiment, forming the body contact region includes doping a portion of the semiconductor layer such that the body contact region is disposed along a vertical surface of the semiconductor layer and is spaced apart from a lateral surface of the semiconductor layer. In a further particular embodiment, the process further includes forming a conductive plug that is electrically connected to the source region, the body contact region, and the second conductive structure.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising a transistor structure, comprising:
    a patterned semiconductor layer overlying a substrate and having a primary surface, wherein the patterned semiconductor layer defines a first trench and a second trench that extend from the primary surface towards the substrate, and wherein the first and second trenches are disposed in an active area of the electronic device;
    first conductive structures within each of the first and second trenches;
    a gate electrode within the first trench and electrically insulated from the first conductive structure;
    a first insulating member disposed between the gate electrode and the first conductive structure within the first trench;
    a second conductive structure within the second trench, wherein the second conductive structure is electrically connected to the first conductive structures and is electrically insulated from the gate electrode;
    a second insulating member disposed between the second conductive structure and the first conductive structure within the second trench, other first trenches substantially identical to the first trench;
other gate electrodes within the other first trenches;
other second trenches having different widths as compared to each other; and
other second conductive structures within the other second trenches,
wherein a ratio of a first number of gate electrodes to a second number of second conductive structures is in a range of approximately 0.75:1 to approximately 1.5:1.

2. The electronic device of claim 1, further comprising:
a source region within the patterned semiconductor layer, and wherein from a top view, the source region is disposed between the first and second trenches; and
a body contact region within the patterned semiconductor layer and between the first and second trenches.

3. The electronic device of claim 2, wherein the source region is disposed over substantially all of the body contact region.

4. The electronic device of claim 2, wherein the body contact region is disposed along a lateral surface of the second trench.

5. The electronic device of claim 1, wherein in a direction substantially orthogonal to a channel length, the second conductive structure is wider than the first conductive structure within the second trench.

6. The electronic device of claim 1, wherein in a direction substantially orthogonal to a channel length, the second conductive structure is narrower than the first conductive structure within the second trench.

7. The electronic device of claim 1, wherein from a cross-sectional view, within the first and second trenches:
the first conductive structures have substantially a same composition and dimensions;
the first and second insulating members have substantially a same composition and dimensions;
the gate electrode and the second conductive structure have substantially a same composition;
bottom portions of the gate electrode and the second conductive structure have substantially identical bottom surfaces; and
an uppermost point of the gate electrode lies at a first elevation, and an uppermost point of the second conductive structure lies at a second elevation, wherein the primary surface generally corresponds to a third elevation that is closer to the first elevation than the second elevation.

8. An electronic device comprising a transistor structure, comprising:
a patterned semiconductor layer overlying a substrate and having a primary surface, wherein the patterned semiconductor layer defines a first trench and a second trench that extend from the primary surface towards the substrate;
first conductive structures within each of the first and second trenches;
a gate electrode within the first trench and electrically insulated from the first conductive structure;
a first insulating member disposed between the gate electrode and the first conductive structure within the first trench;
a second conductive structure within the second trench;
a second insulating member disposed between the second conductive structure and the first conductive structure within the second trench; and
a source region adjacent to the first trench, wherein the source region is electrically connected to the second conductive structure.

9. The electronic device of claim 8, wherein, from a top view, the source region is disposed between the first and second trenches.

10. The electronic device of claim 8, further comprising:
a body contact region within the semiconductor layer adjacent to the first and second trenches; and
a conductive plug that directly contacts the source region, the body contact region, and the second conductive structure.

11. The electronic device of claim 10, wherein the body contact region is disposed along a vertical surface of the semiconductor layer and is spaced apart from a lateral surface of the semiconductor layer.

12. The electronic device of claim 8, wherein the electronic device includes a plurality of first and second trenches, and wherein a ratio of a number of first trenches to a number of second trenches is in a range of approximately 0.75:1 to approximately 1.5:1.

13. The electronic device of claim 8, wherein the conductive layer includes silicon.

14. The electronic device of claim 8, wherein the gate electrode comprises a gate member that includes a narrower portion disposed within the first trench and a wider portion that lies at an elevation above the primary surface.

15. An electronic device comprising a transistor structure, comprising:
a patterned semiconductor layer overlying a substrate and having a primary surface, wherein the patterned semiconductor layer defines a first trench and a second trench that extend from the primary surface towards the substrate, wherein the first and second trenches are disposed in an active area of the electronic device;
first conductive structures within each of the first and second trenches;
a gate electrode within the first trench and electrically insulated from the first conductive structure;
a first insulating member disposed between the gate electrode and the first conductive structure within the first trench;
a source region disposed adjacent to the first trench;
a second insulating member disposed within the second trench;
a second conductive structure disposed in the second trench, wherein, within the second trench, the second insulating member is disposed between the second conductive structure and the first conductive structure, and wherein the first and second conductive structures that lie within the second trench are electrically connected to each other;
a body contact region within the semiconductor layer adjacent to the first and second trenches; and
a conductive plug that directly contacts the source region, the body contact region, and the second conductive structure.

16. The electronic device of claim 15, wherein the body contact region is disposed along a vertical surface of the semiconductor layer and is spaced apart from a lateral surface of the semiconductor layer.

17. The electronic device of claim 15, wherein the gate electrode comprises a gate member that includes a narrower portion disposed within the first trench and a wider portion that lies at an elevation above the primary surface.

* * * * *